United States Patent [19]

Ijichi et al.

[11] Patent Number: 4,725,920
[45] Date of Patent: Feb. 16, 1988

[54] HOLDING STRUCTURE OF SUBSTRATES

[75] Inventors: Sadayoshi Ijichi; Tetsuro Umemoto, both of Soma, Japan

[73] Assignee: Alps Electric Co., Ltd., Japan

[21] Appl. No.: 785,784

[22] Filed: Oct. 9, 1985

[30] Foreign Application Priority Data

Oct. 9, 1984 [JP] Japan ............................ 59-152747[U]

[51] Int. Cl.[4] ................................................ H05K 7/20
[52] U.S. Cl. ..................................... 361/388; 361/386; 361/414
[58] Field of Search ............... 361/386, 388, 395, 399, 361/412, 414, 424

[56] References Cited

U.S. PATENT DOCUMENTS

| 3,348,101 | 10/1967 | Klein et al. | 361/388 |
| 3,506,877 | 4/1970 | Owen | 361/424 |
| 4,310,870 | 1/1982 | Kia et al. | 361/399 |
| 4,388,672 | 6/1983 | Skill | 361/395 |
| 4,498,119 | 2/1985 | Cronin | 361/386 |

FOREIGN PATENT DOCUMENTS 1411080  10/1975  United Kingdom ................ 361/399

*Primary Examiner*—Leung Philip H.
*Assistant Examiner*—Gregory D. Thompson
*Attorney, Agent, or Firm*—Guy W. Shoup

[57] ABSTRACT

A multiple substrate assembly has a metallic plate sandwiched in between two printed circuit substrates. The metallic plate has cut and erect segments passing through thru-holes formed in at least one substrate, so that printed circuit paths on the outer surfaces of the substrates can be grounded to the metallic plate.

3 Claims, 3 Drawing Figures

HOLDING STRUCTURE OF SUBSTRATES

BACKGROUND OF THE INVENTION

1. Field of the Invention

This invention relates to a holding structure of substrates utilized in the tuners of television sets and the like or home converters for the same.

2. Description of the Prior Art

The conventional holding structure for mounting and grounding multiple layers of printed circuit substrates will be described with reference to FIG. 3 which is a sectional view showing a grounding structure of the conventional multiple substrate assembly. A first printed circuit substrate 1 and a second printed circuit substrate 2 are piled one upon another, and conductive patterns 3, 4 are provided, respectively, on the upper face of the first printed circuit substrate 1 and on the under face of the second printed circuit substrate 2. Reference numerals 5, 6, 7, 8 are thru-holes bored respectively in the conductive pattern 3, first printed circuit substrate 1, second printed circuit substrate 2, and conductive pattern 4. Through these thru-holes 5, 6, 7, and 8 an electric part 9 is passed with both ends being secured by solder 10, 11 to the conductive patterns 3, 4 of the first and second printed circuit substrates 1, 2. Further, on the first printed circuit substrate 1 a grounding conductive pattern 12 is provided, and, correspondingly, a grounding conductive pattern 13 is provided on the second printed circuit substrate 2. Reference numerals 14, 15, 16, and 27 are holes formed respectively in the conductive pattern 12, first printed circuit substrate 1, second printed circuit substrate 2, and conductive pattern 13, into which a thru-hole pin A is inserted. This thru-hole pin A passes through the holes 14, 15, 16, 17 and projects on the first and second printed circuit substrates 1, 2 and its ends are secured by solder 18, 19. One end of the conductive pattern 13 is secured by solder 21 to a chassis 20.

Because grounding of the first and second printed circuit substrates is achieved, as shown in FIG. 3, a thru-hole pin is needed, which increases the number of parts. Further, the grounding conductive patterns 12, 13 must be set in fixed alignment with the first and second printed circuit substrates 1, 2. Thus, the degree of freedom in designing other circuit patterns is limited, shielding between the first and second printed circuit substrates 1, 2 is impossible, and grounding efficiency is inferior because the grounding path is led out by means of the narrow grounding conductive pattern 13 to the chassis 20 and soldered at 21.

Also, because the substrate 2 and the chassis 20 have different coefficients of thermal expansion, fractures in the solder 21 securing them together can be easily formed.

SUMMARY OF THE INVENTION

It is the object of the present invention to provide a novel holding structure for multiple printed circuit substrates, which eliminates the generation of fractures in solder, permits good grounding and shielding between the substrates, decreases the number of parts, and enhances the degree of circuit design freedom.

The present invention will be summarized with reference to FIGS. 1 and 2.

Two printed circuit substrates 1, 2 are assembled on a metallic grounding plate 24 having upright segments 22, 23. The printed circuit substrate 1 is bored in correspondence to the upright segments 22 with holes 25 through which the segments 22 pass and project on that substrate. The segments 22 and the conductive patterns 26 formed around the holes 25 are secured together by solder 27. Around the periphery of the metallic grounding plate 24 there are further provided plural connection segments 28, which are tacked to the chassis 20 through elastic contact and secured together by solder 29.

The foregoing structure functions as described below.

By sandwiching the metallic grounding plate 24 in between the first and second printed circuit substrates 1, 2 and providing the upright segments 22, 23 on the metallic grounding plate 24, the thru-hole pin A is eliminated, and there is no need for other grounding means and for making the conductive patterns 26, 30 of the first and second printed circuit substrates 1, 2 align with each other vertically. Because the metallic grounding plate 24 is sandwiched in between the first and second printed circuit substrates, a shielding effect is also provided. Because the conduction path to the chassis is realized by the wide metallic grounding plate 24, the grounding is very reliable. Because, in place of soldering at 21 between the conductive pattern 13 of the second printed circuit substrate 2 and the chassis 20, the connection segments 28 of the metallic grounding plate 24 are connected to the chassis 20 and they are substantially equal in coefficient of thermal expansion where they are soldered at 29, there occurs no fracture under thermal shock.

DESCRIPTION OF THE PREFERRED EMBODIMENT

Figure 1:
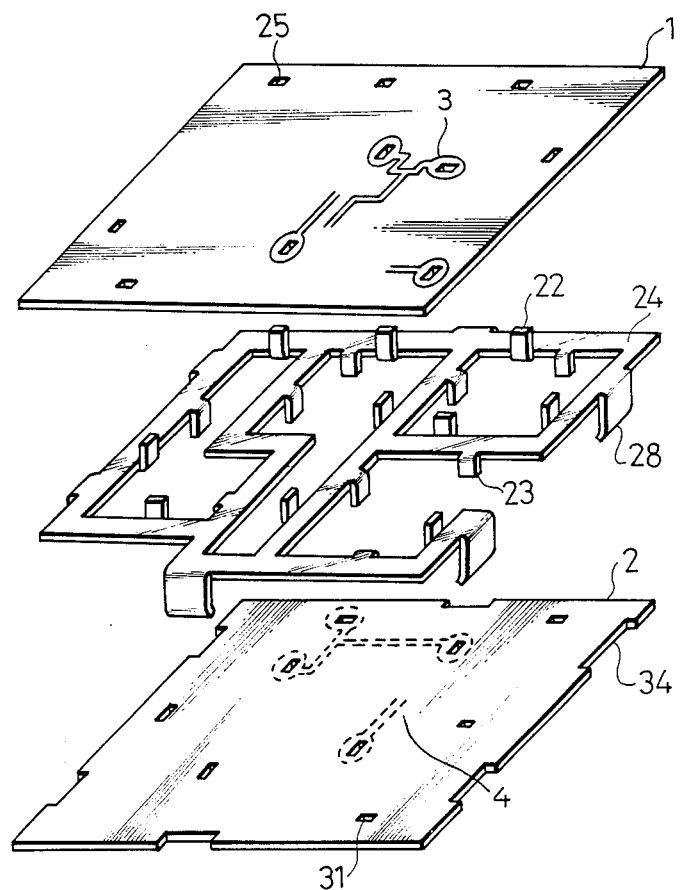
FIG. 1 is an exploded perspective view of a multiple substrate assembly representing one embodiment of the present invention.

The preferred embodiment of the present invention will be described with reference to FIGS. 1 and 2, wherein the portions identical to those of the conventional example bear the same symbols and their detailed explanation is omitted. The metallic grounding plate 24 is sandwiched in between the first and second printed circuit substrates 1, 2. The grounding plate has tabs or segments cut from the plate material and bent so as to be erect in the vertical direction of one or the other substrates. These segments are herein referred to as cut and erect segments 22, 23. Around the periphery of the metallic grounding plate 24 there are provided connection segments 28. On the first and second printed circuit substrates 1, 2 there are provided the thru-holes 25, 31 into which the cut and erect segments 22, 23 are inserted. The grounding conductive patterns 26, 30 surround the thru-holes 25, 31, the thru-holes 6, 7 are provided for electric part 9, and the conductive patterns 3, 4 surround the thru-holes 6, 7. Around the periphery of the second printed circuit substrate 2 there are provided notches 34 for receiving the connection segments 28. The external dimensions of the first and second printed circuit substrates 1, 2 are made smaller than the inner size of the chassis 20 so that the periphery of the substrates and the inner surface of the chassis 20 are not bridged by solder.

Figure 2:
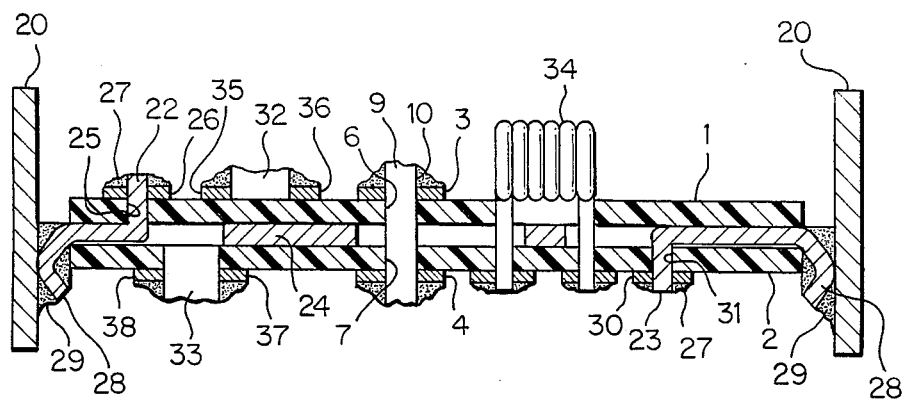
FIG. 2 is a sectional view of the multiple substrate assembly fitted in a chassis.
Figure 3:
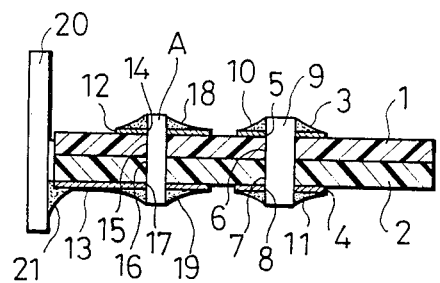
FIG. 3 is a sectional view showing the grounding structure of the multiple printed circuit substrates in the prior art.

In the process of assembling and wiring of both printed circuit substrates 1, 2, as shown in FIG. 2, the multiple substrate assembly is formed by sandwiching the metallic grounding plate 24 in between the first and second printed circuit substrates 1, 2, other electric parts 32, 33 are mounted on the surfaces of the first and second printed circuit substrates 1, 2, electrode portions on both ends of the electric parts 32, 33 can be soldered to the circuit patterns 35, 36, 37, 38 on the first and second printed circuit substrates 1, 2. Besides the electric part 9 shown in the conventional example, lead wires of an electric part 34 can be inserted into the thru-holes passing through the multiple substrate assembly, and their end portions soldered to the patterns wired on the printed circuit substrate. Further, the multiple substrate assembly is fitted inside the chassis 20, the conection segments 28 of the metallic grounding plate 24 come into contact elastically with the chassis 20 and are tacked thereto, and these connection segments 28 and chassis 20 are soldered at 29. Then, the conductive patterns 26, 30 of the first and second printed circuit substrates 1, 2 and the cut and erect segments 22, 23 of the metallic grounding plate 24 are connected by solder at 27 so that a grounding path goes through the metallic grounding plate 24 to the connection segments 28, which are connected to the chassis 20 by solder at 29.

The following effects result from the present invention:

(1) Both chassis 20 and connection segment 28 are metal and have substantially identical coefficients of thermal expansion, thus, no fracture occurs in the solder 29 portion.

(2) Because the metallic grounding plate is interposed between the first and second printed circuit substrates, the conductive width can be widened, better grounding can be provided, and shielding between the substrates can be incorporated. Further, no thru-hole pin is needed, the number of parts can be lessened, and the number of corresponding assembling steps can be reduced.

(3) At the time of designing the circuits of the first and second substrates the work of mating mutually the upper and lower conductive patterns with respect to the thru-hole position becomes unnecessary, thus, the degree of freeom in design is increased.

While the preferred embodiment has been described, variations thereto (for example, applying the same to a power plane as well as a ground plane of the circuit) will occur to those skilled in the art within the scope of the present inventive concepts which are delineated by the following claims.

What is claimed is:

1. A structure holding and grounding a pair of printed circuit substrates (1, 2) to a chassis (20) comprising:

a metallic plate (24) interposed horizontally between the two substrates (1, 2) in parallel therewith, the plate having a plurality of erect segments (22, 23) each cut from a portion of said plate and bent erect in a vertical direction toward a respective one of said substrates;

each substrate (1, 2) having at least one grounding hole (25, 31) receiving an erect segment (22, 23) of said metallic plate (24) projected therethrough from a side facing said plate to an external side of the substrate on which a printed circuit pattern is provided, the erect segment (22, 23) being soldered to a respective grounding part (26, 30) of the printed circuit pattern for grounding thereof;

said metallic plate (24) having on a peripheral edge thereof at least one connection segment (28) bent from the plate so as to form a metallic tongue having a certain bending resilience, said resilient tongue being placed in resilient contact with a portion of said chassis (20) and soldered thereto (29) to ground said grounding parts (26, 30) of the printed circuit patterns of said substrates (1, 2) through said interposed metallic plate to said chassis.

2. A structure as set forth in claim 1, wherein plural thru-holes for receiving electric parts and lead wires therefor are formed in the two substrates, and conductive patterns are provided around said thru-holes on said substrates.

3. A structure as set forth in claim 1, wherein said metallic plate has a coefficient of thermal expansion substantially identical to that of the chassis.

* * * * *